United States Patent
Nakagawa et al.

(10) Patent No.: US 11,264,303 B2
(45) Date of Patent: Mar. 1, 2022

(54) POWER SEMICONDUCTOR DEVICE AND METHOD OF MANUFACTURING THE SAME

(71) Applicant: Mitsubishi Electric Corporation, Tokyo (JP)

(72) Inventors: Shinya Nakagawa, Fukuoka (JP); Takuya Shiraishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/838,955

(22) Filed: Apr. 2, 2020

(65) Prior Publication Data

US 2020/0357719 A1 Nov. 12, 2020

(30) Foreign Application Priority Data

May 8, 2019 (JP) .............................. JP2019-088181

(51) Int. Cl.
*H01L 23/373* (2006.01)
*H01L 23/00* (2006.01)
(Continued)

(52) U.S. Cl.
CPC ...... *H01L 23/3735* (2013.01); *H01L 21/4882* (2013.01); *H01L 21/565* (2013.01);
(Continued)

(58) Field of Classification Search
CPC ... H01L 23/3735; H01L 24/48; H01L 25/072; H01L 21/4882; H01L 21/565;
(Continued)

(56) References Cited

U.S. PATENT DOCUMENTS

2003/0205730 A1* 11/2003 Ohuchi ............... H01L 23/3185
257/200
2007/0240899 A1* 10/2007 Sakamoto ............. H01L 21/565
174/252

(Continued)

FOREIGN PATENT DOCUMENTS

DE 10 2014 100 282 A1 7/2014
JP 2006-100759 A 4/2006
JP 2008-047843 A 2/2008

OTHER PUBLICATIONS

An Office Action issued by the German Patent Office dated Apr. 27, 2021, which corresponds to German Patent Application No. 10 2020 111 619.5 and is related to U.S. Appl. No. 16/838,955 with English language translation.

*Primary Examiner* — Patricia D Valenzuela
(74) *Attorney, Agent, or Firm* — Studebaker & Brackett PC

(57) ABSTRACT

A power semiconductor device includes a frame, a semiconductor element, a substrate, and a sealing resin. The semiconductor element is disposed on the frame. The substrate is disposed on a side of the frame opposite to a side on which the semiconductor element is disposed. The sealing resin seals the semiconductor element and the substrate. The substrate includes a metal sheet, a first insulating sheet on one main surface side of the metal sheet, and a second insulating sheet on the other main surface side of the metal sheet. The metal sheet has flexibility at a normal temperature.

9 Claims, 14 Drawing Sheets

(51) Int. Cl.
  *H01L 25/07* (2006.01)
  *H01L 21/48* (2006.01)
  *H01L 21/56* (2006.01)
  *H01L 25/00* (2006.01)
  *H01L 23/495* (2006.01)
(52) U.S. Cl.
  CPC ............ *H01L 24/48* (2013.01); *H01L 25/072* (2013.01); *H01L 25/50* (2013.01); *H01L 23/49575* (2013.01); *H01L 24/05* (2013.01); *H01L 2224/48132* (2013.01)
(58) Field of Classification Search
  CPC ........... H01L 25/50; H01L 2224/48132; H01L 23/3121; H01L 23/49531; H01L 23/49562; H01L 23/49575; H01L 23/142; H01L 23/3114; H01L 21/4803; H01L 21/56; H01L 23/3672; H01L 23/3736; H01L 24/05
  See application file for complete search history.

(56) References Cited

U.S. PATENT DOCUMENTS

| | | | |
|---|---|---|---|
| 2014/0197552 A1 | 7/2014 | Otremba et al. | |
| 2015/0054162 A1* | 2/2015 | Kim | H01L 21/4846 257/766 |
| 2019/0103402 A1* | 4/2019 | Tsuchimochi | H01L 23/08 |

\* cited by examiner

POWER SEMICONDUCTOR DEVICE AND METHOD OF MANUFACTURING THE SAME

BACKGROUND OF THE INVENTION

Field of the Invention

The present disclosure relates to a power semiconductor device and a method of manufacturing the same.

Description of the Background Art

A package of a transfer mold structure as a power semiconductor device is commercially available. The power semiconductor device requires: efficient dissipation of heat emitted from a switching element and heat flowing through a frame that forms its circuit; and electrical insulation of the switching element and the frame from their surrounding area. The above-mentioned heat dissipation is achieved mainly using a so-called insulating sheet that is a sheet made of a resin material having insulation properties. However, if the adhesiveness between the frame and the insulating sheet is poor, heat dissipation between the insulating sheet and the frame is inhibited. Furthermore, if the adhesiveness between the frame and the insulating sheet is poor, the insulation properties therebetween also deteriorates.

Japanese Patent Laying-Open No. 2008-47843 discloses a circuit device in which an insulating layer is sandwiched between an interconnection layer and a conductive pattern. Japanese Patent Laying-Open No. 2006-100759 discloses a circuit device in which an insulating layer is sandwiched between a conductive pattern and a metal-made circuit substrate. According to these disclosed techniques, the insulating layer ensures electrical insulation properties between a conductive pattern and a conductive member adjacent thereto.

SUMMARY OF THE INVENTION

According to Japanese Patent Laying-Open Nos. 2008-47843 and 2006-100759, the metal layer and the insulating layer included in the circuit device are formed to be relatively thick, to thereby enhance the flatness of each of the surfaces of these layers. In this state, the metal layer and the insulating layer are joined to each other. Thus, the material costs of the metal layer and the insulating layer are increased, and also, the processing of the metal layer and the insulating layer becomes complicated. However, if the metal layer and the insulating layer are reduced in thickness in the technique disclosed in the above-mentioned documents, the curving direction of the metal layer and the curving direction of the insulating layer may not coincide with each other. This causes partial peeling between the metal layer and the insulating layer, so that sufficient adhesiveness between the metal layer and the insulating layer cannot be ensured. In other words, the heat dissipation performance and the insulation performance between the metal layer and the insulating layer may deteriorate.

The present disclosure has been made in consideration of the above-described problems. An object of the present disclosure is to provide a power semiconductor device and a method of manufacturing the same, by which sufficient adhesiveness between a substrate and a frame can be ensured by controlling the substrate such that the curving direction of the substrate coincides with the curving direction of the frame to which the substrate is joined.

A power semiconductor device according to the present disclosure includes a frame, a semiconductor element, a substrate, and a sealing resin. The semiconductor element is disposed on the frame. The substrate is disposed on a side of the frame opposite to a side on which the semiconductor element is disposed. The sealing resin seals the semiconductor element and the substrate. The substrate includes a metal sheet, a first insulating sheet on one main surface side of the metal sheet, and a second insulating sheet on the other main surface side of the metal sheet opposite to the one main surface side. The metal sheet has flexibility at a normal temperature.

According to a method of manufacturing a power semiconductor device in the present disclosure, a semiconductor element is mounted on a frame to obtain a frame member. A substrate is prepared that includes a metal sheet having flexibility at a normal temperature, a first insulating sheet on one main surface side of the metal sheet, and a second insulating sheet on the other main surface side of the metal sheet opposite to the one main surface side. The substrate is combined with the frame member. The substrate and the frame member combined with each other are hardened and bonded to each other with a sealing resin. In the preparing the substrate, a thickness of the first insulating sheet and a thickness of the second insulating sheet are adjusted based on a difference of a coefficient of linear expansion between the metal sheet and each of the first insulating sheet and the second insulating sheet such that the substrate has a shape conforming to deformation of the frame member.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

The present embodiments will be hereinafter described with reference to the accompanying drawings. The X direction, the Y direction, and the Z direction are introduced for convenience of description.

First Embodiment

<Introduction>

Figure 1:
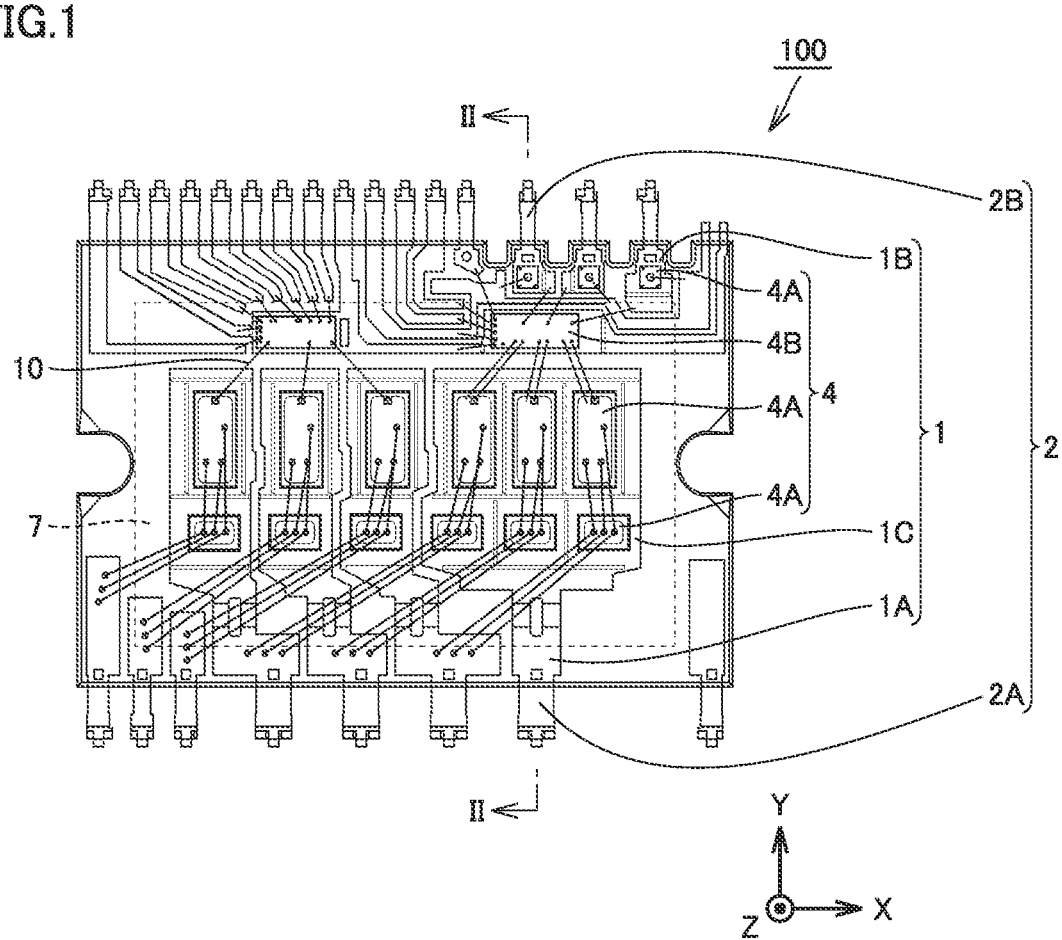
FIG. 1 is a schematic plan view showing the configuration of a power semiconductor device in the first embodiment.
Figure 2:
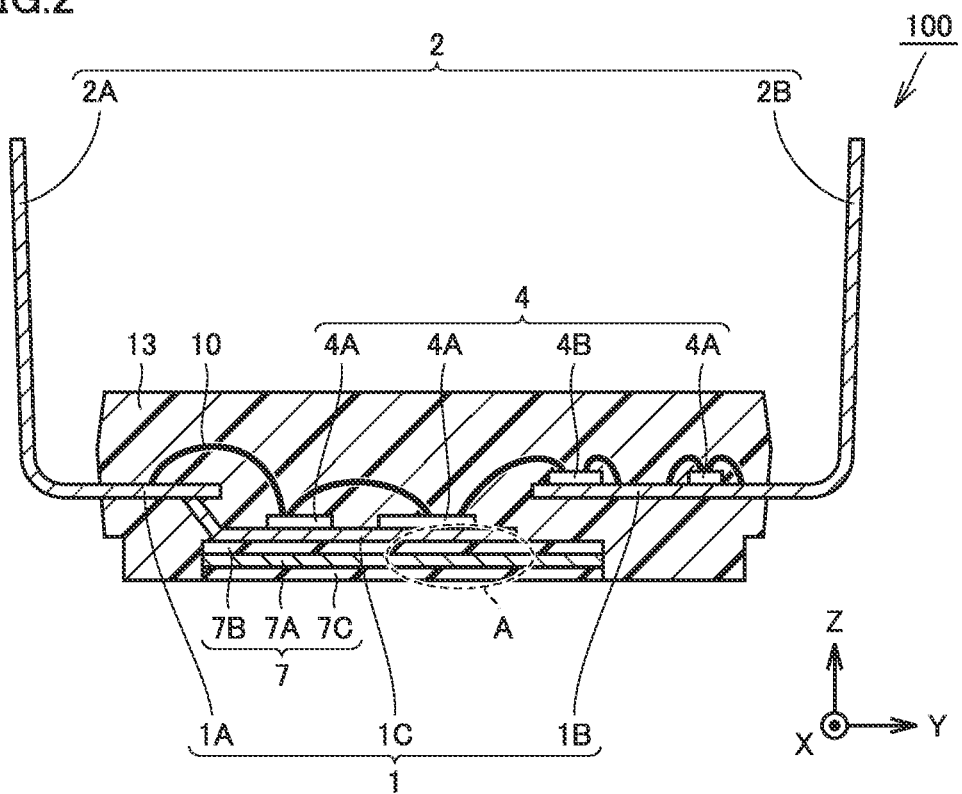
FIG. 2 is a schematic diagram showing a cross section taken along a line II-II in FIG. 1.

The characteristic configuration of a power semiconductor device in the present embodiment will be first described with reference to FIGS. 1 and 2. FIG. 1 is a schematic plan view showing the configuration of a power semiconductor device in the first embodiment. FIG. 2 is a schematic diagram showing a cross section taken along a line II-II in FIG. 1. Referring to FIGS. 1 and 2, a power semiconductor device 100 in the present embodiment mainly includes a frame 1, a semiconductor element 4, a substrate 7, a wire 10, and a sealing resin 13. Semiconductor element 4 is disposed on frame 1. Substrate 7 is disposed on the lower side of frame 1 in the Z direction that is opposite to the side on which semiconductor element 4 is disposed, that is, opposite to the upper side of frame 1 in the Z direction. Sealing resin 13 seals semiconductor element 4 and substrate 7. Substrate 7 includes a metal sheet 7A, a first insulating sheet 7B, and a second insulating sheet 7C. Metal sheet 7A forming substrate 7 has flexibility at a normal temperature. Thus, metal sheet 7A is more likely to curve to protrude upward or downward in the Z direction in the figure. In the following, power semiconductor device 100 having such a configuration and properties will be described in greater detail.

<Configuration of Power Semiconductor Device>

Power semiconductor device 100 is a package having a transfer mold structure, for example. Frame 1 includes three frames including a frame 1A, a frame 1B and a frame 1C that are formed by dividing a single frame member. Frame 1A is disposed on the most negative side in the Y direction among these three frames. Frame 1B is disposed on the most positive side in the Y direction among these three frames. Frame 1C is attached to the lower side of frame 1A in the Z direction so as to be connected to frame 1A. In other words, frame 1C is connected to frame 1A so as to branch off from frame 1A. Frame 1C is entirely disposed inside sealing resin 13 and sealed such that its entire surface is hidden inside sealing resin 13. In contrast, frame 1A and frame 1B each include: a region sealed so as to be accommodated inside sealing resin 13; and a region exposed to the outside of sealing resin 13. It should be noted that frames 1A and 1B each may be entirely accommodated inside sealing resin 13.

Semiconductor element 4 is joined onto the upper surface of frame 1B in the Z direction, particularly, in a region of frame 1B that is accommodated inside sealing resin 13. Specifically, a switching element 4A and an integrated circuit element 4B are included as semiconductor element 4. Both switching element 4A and integrated circuit element 4B are disposed on the surface of frame 1B. A metal oxide semiconductor field effect transistor (MOSFET) and the like are included in switching element 4A on the surface of frame 1B. Integrated circuit element 4B has a function of driving switching element 4A. Switching element 4A and integrated circuit element 4B on the surface of frame 1B are electrically connected to each other by wire 10. Switching element 4A or integrated circuit element 4B on frame 1B may be electrically connected to the surface of frame 1B by wire 10.

As semiconductor element 4, switching element 4A is joined onto the upper surface of frame 1C in the Z direction. Switching elements 4A on the surface of frame 1C are electrically connected to each other by wire 10. Furthermore, integrated circuit element 4B on frame 1B and switching element 4A on frame 1C are connected to each other by wire 10. Integrated circuit element 4B may be joined also onto the surface of frame 1C and electrically connected by wire 10 to switching element 4A.

In FIGS. 1 and 2, semiconductor element 4 is not joined onto the upper surface of frame 1A in the Z direction. In this way, semiconductor element 4 may be joined to only one of two types of frames 1A and 1B integrated with external terminal 2 (described later). However, a semiconductor element or a conductive pad may be formed also on the upper surface of frame 1A in the Z direction. Switching element 4A of frame 1C is connected by wire 10 to the surface of frame 1A. In the case where semiconductor element 4 and the like are joined particularly onto the region of frame 1A that is accommodated inside sealing resin 13, semiconductor element 4 on the surface of frame 1A and semiconductor element 4 on the surface of frame 1C may be electrically connected to each other through wire 10. As described above, wire 10 provides electrical connection between the elements and also between each element and each member, thereby forming a circuit inside power semiconductor device 100.

From the region from which frame 1A is exposed to the outside of sealing resin 13, an external terminal 2A extends toward the outside of sealing resin 13. External terminal 2A is formed at an end portion of frame 1A integrally with frame 1A. From the region from which frame 1B is exposed to the outside of sealing resin 13, an external terminal 2B extends toward the outside of sealing resin 13. External terminal 2B is formed at an end portion of frame 1B integrally with frame 1B. External terminals 2A and 2B may extend straight in the Y direction, for example. However, as shown in FIG. 2, external terminals 2A and 2B (that is, external terminal 2) may extend toward the positive side in the Z direction. This is because frames 1A and 1B each have a region extending in the Y direction and then bent to extend toward the positive side in the Z direction. As described above, external terminals 2A and 2B are connected integrally to frames 1A and 1B, respectively, on the outside of sealing resin 13. External terminals 2A and 2B each are provided as external terminal 2 connectable to the outside of power semiconductor device 100.

It is preferable that frame 1 and external terminal 2 each are formed of a metal material, such as copper, a copper alloy or aluminum, that is excellent in both thermal conductivity and electrical conductivity. Thereby, frame 1 forms a circuit inside power semiconductor device 100 while external terminal 2 electrically connects this circuit to the circuit on the outside of power semiconductor device 100.

Substrate 7 is in contact with the lower surface of frame 1C that is disposed on the lowest side of frame 1 in the Z direction. Specifically, frame 1C and substrate 7 are collectively sealed by sealing resin 13, so that substrate 7 comes into close contact with the lower surface of frame 1C in an integrated manner. Substrate 7 is formed by stacking first insulating sheet 7B, metal sheet 7A, and second insulating sheet 7C that are arranged in this order from the top. Metal sheet 7A has a function of dissipating heat emitted by semiconductor element 4 to the outside of power semiconductor device 100 from the lower side in the Z direction. In addition to this heat dissipation function, first insulating sheet 7B and second insulating sheet 7C each have a function of providing electrical insulation between the members, for example, between semiconductor element 4 and metal sheet 7A.

In FIG. 2, the lower surface of second insulating sheet 7C is exposed from sealing resin 13 while the surfaces of respective portions of substrate 7 other than this lower surface are covered inside sealing resin 13. Even such a state is also defined as the state where substrate 7 is sealed by sealing resin 13. For the purpose of improving the performance of heat dissipation from substrate 7 to the outside of power semiconductor device 100, it is preferable that the lower surface of second insulating sheet 7C is exposed. However, as long as the performance of heat dissipation from substrate 7 to the outside of power semiconductor device 100 can be ensured, the entire substrate 7 including the lowermost surface of second insulating sheet 7C may be configured to be completely covered inside sealing resin 13.

It is preferable that metal sheet 7A is made of a material selected from the group consisting of copper, iron, aluminum, and stainless steel. It is preferable that metal sheet 7A has a thickness, that is, a dimension in the Z direction, equal to or greater than 0.01 mm and equal to or less than 0.2 mm. In particular, the lower limit value of the thickness of metal sheet 7A is more preferably equal to or greater than 0.03 mm, and is still more preferably 0.05 mm. Also, the upper limit value of the thickness of metal sheet 7A is more preferably equal to or less than 0.15 mm, and particularly, still more preferably equal to or less than 0.10 mm.

As described above, metal sheet 7A has flexibility at a normal temperature. The term "normal temperature" used herein means a temperature range of about 15° C. or higher and 40° C. or lower. Also, the term "has flexibility" used herein means the property of the material that displaces (that is, being flexible) by 1 mm or more when it receives force of 100N.

First insulating sheet 7B and second insulating sheet 7C are preferably made of a material having the same properties. For example, first insulating sheet 7B and second insulating sheet 7C each are preferably formed of a thermosetting resin material such as an epoxy resin that is filled with a fibrous or particulate filler.

Figure 3:
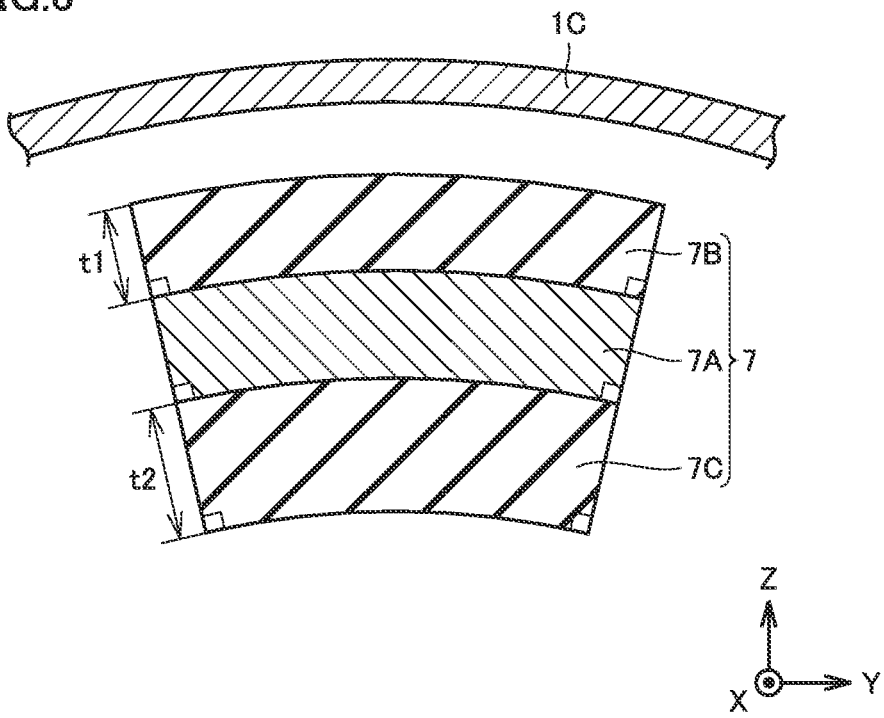
FIG. 3 is a schematic cross-sectional view showing the direction in which a substrate is to be curved in the case where a frame sealed to be integrated with the substrate curves to protrude upward.
Figure 4:
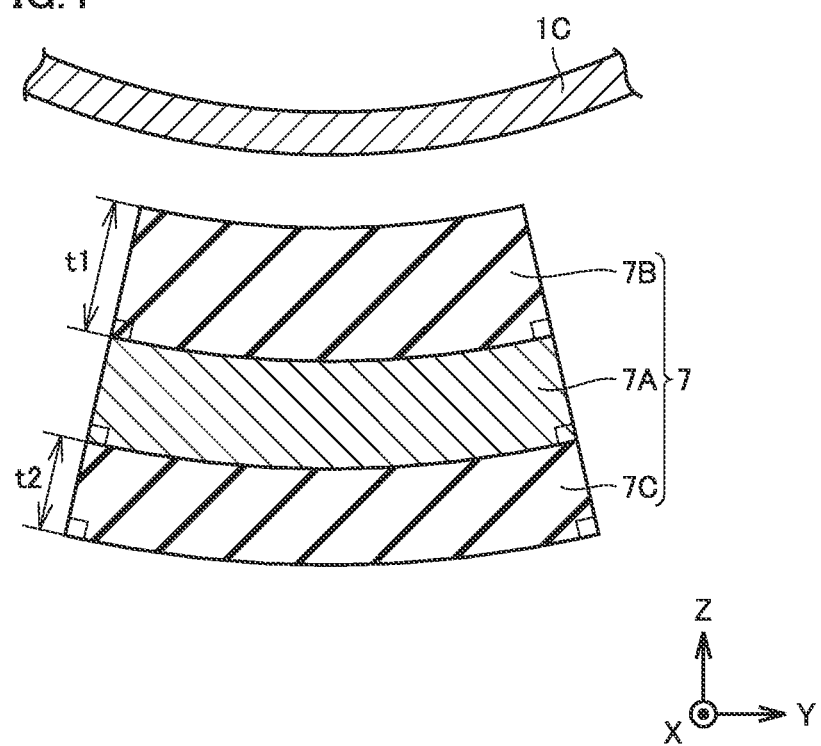
FIG. 4 is a schematic cross-sectional view showing the direction in which the substrate is to be curved in the case where the frame sealed to be integrated with the substrate curves to protrude downward.

Frame 1C is normally slightly curved with respect to the thickness direction due to the thermal hysteresis added in the step prior to the step in which frame 1C is sealed integrally with substrate 7. FIG. 3 is a schematic cross-sectional view showing the direction in which the substrate is to be curved in the case where the frame sealed to be integrated with the substrate curves to protrude upward. FIG. 3 shows the first example of the relation of the curving direction between frame 1C and substrate 7 in a region A surrounded by a dotted line in FIG. 2. Referring to FIG. 3, when frame 1C curves upward in the Z direction, that is, curves to protrude upward, it is preferable that substrate 7 brought into contact with the lower surface of frame 1C by sealing curves to protrude upward. FIG. 4 is a schematic cross-sectional view showing the direction in which the substrate is to be curved in the case where the frame sealed to be integrated with the substrate curves to protrude downward. FIG. 4 shows the second example of the relation of the curving direction between frame 1C and substrate 7 in region A surrounded by the dotted line in FIG. 2. Referring to FIG. 4, when frame 1C curves downward in the Z direction, that is, curves to protrude downward, it is preferable that substrate 7 brought into contact with the lower surface of frame 1C by sealing curves to protrude downward.

Thus, it is preferable that the first direction in which frame 1C as a part of frame 1 curves with respect to the thickness direction coincides with the second direction in which substrate 7 coming into contact with the lower side of frame 1C curves with respect to the thickness direction. The first direction and the second direction each mean an upwardly protruding direction or a downwardly protruding direction.

In this case, the coefficient of linear expansion of metal sheet 7A is defined as α1, and the coefficient of linear expansion of each of first insulating sheet 7B and second insulating sheet 7C is defined as α2. For example, when α1<α2, substrate 7 curves in the second direction with respect to the thickness direction due to the difference of the coefficient of linear expansion between metal sheet 7A and each of first insulating sheet 7B and second insulating sheet 7C. In this case, the thickness of first insulating sheet 7B is defined as t1, and the thickness of second insulating sheet 7C is defined as t2. When the first direction in which frame 1C curves is an upwardly protruding direction as shown in FIG. 3, the second direction in which substrate 7 curves is also preferably an upwardly protruding direction. For this purpose, it is preferable to control the thickness relation such that t1<t2. Furthermore, when the first direction in which frame 1C curves is a downwardly protruding direction as shown in FIG. 4, the second direction in which substrate 7 curves is also preferably a downwardly protruding direction. For this purpose, it is preferable to control the thickness relation such that t1>t2.

In this way, the values of the respective thicknesses of first insulating sheet 7B and second insulating sheet 7C determine the relation of magnitude therebetween. Thereby, the direction in which substrate 7 curves can be controlled to coincide with the direction in which frame 1C curves. This is due to the following reason. In the step of manufacturing substrate 7, metal sheet 7A, first insulating sheet 7B and the like that are stacked on one another are heated and integrated with each other as described below. In this case, the thermosetting resin material forming first insulating sheet 7B and the like is hardened and shrunk. Coefficient of linear expansion α2 of each of first insulating sheet 7B and the like is larger than coefficient of linear expansion α1 of metal sheet 7A. Thus, first insulating sheet 7B and the like are greater in dimensional change by heating than metal sheet 7A, and greater in shrinkage amount than metal sheet 7A. Accordingly, in the case where first insulating sheet 7B and second insulating sheet 7C are made of the same resin material, and on the condition that t1<t2 as shown in FIG. 3, then, second insulating sheet 7C having a greater thickness and a greater volume is greater in shrinkage amount than first insulating sheet 7B. On the condition that t1>t2 as shown in FIG. 4, first insulating sheet 7B having a greater thickness and a greater volume is greater in shrinkage amount than second insulating sheet 7C.

Thus, in FIG. 3, first insulating sheet 7B is greater in dimension in the Y direction than second insulating sheet 7C. Also, the members deform such that each boundary portion between the members is kept at an approximately right angle. As a result, in the example in FIG. 3, substrate 7 deforms so as to protrude upward. In FIG. 4, second insulating sheet 7C is greater in dimension in the Y direction than first insulating sheet 7B. Also, the members deform such that each boundary portion between the members is kept at an approximately right angle. As a result, in the example in FIG. 4, substrate 7 deforms so as to protrude downward.

Sealing resin 13 seals semiconductor element 4 and substrate 8 as well as at least a part of each of frames 1A and 1B, and frame 1C. Sealing resin 13 also seals wire 10 that connects the members. Sealing resin 13 has a function of electrically insulating the members from one another. Sealing resin 13 is preferably a thermosetting resin such as an epoxy resin.

<Method of Manufacturing Power Semiconductor Device>

Figure 5:
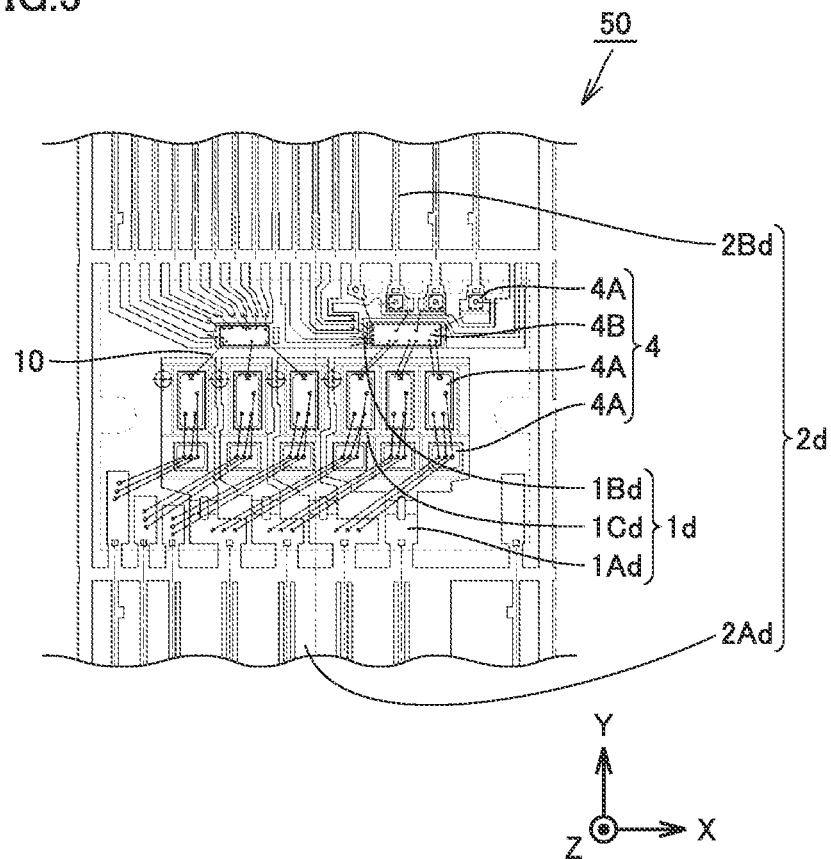
FIG. 5 is a schematic plan view showing the first step of a method of manufacturing the power semiconductor device in the first embodiment.

Then, referring to FIGS. 5 to 13, a method of manufacturing the power semiconductor device in the present embodiment will be hereinafter described. FIG. 5 is a schematic plan view showing the first step of the method of manufacturing the power semiconductor device in the first embodiment. Referring to FIG. 5, a frame 1d is first prepared. In this case, each member having a reference character with a suffix of "d" means that the member is under processing and still not completed. Specifically, frame 1d means a frame in the state before it is cut into frame 1 and external terminal 2 that form power semiconductor device 100. Thus, frame 1d includes frames 1Ad, 1Bd and 1Cd that are to be formed as respective regions of frames 1A, 1B, and 1C. Also, frame 1d has a main portion that is integrally provided with external terminals 2Ad and 2Bd as an external terminal 2d that is to be formed as external terminal 2 but still not cut.

Switching element 4A and integrated circuit element 4B as semiconductor element 4 are mounted at one position on the upper surface of frame 1d in the Z direction and joined by a commonly known method. For example, switching element 4A and integrated circuit element 4B on the surface of frame 1Bd are electrically connected to each other by wire 10. Integrated circuit element 4B on frame 1Bd and switching element 4A on frame 1Cd are connected to each other by wire 10. Switching elements 4A on the surface of frame 1Cd are connected to each other by wire 10. Switching element 4A on frame 1Cd and the surface of frame 1Ad are connected to each other by wire 10. The members are mounted as described above, thereby forming a frame member 50 including frame 1d. Also, due to heating in the above-mentioned step of processing frame member 50, the surface and the like of frame 1Cd curve as described above.

Figure 6:
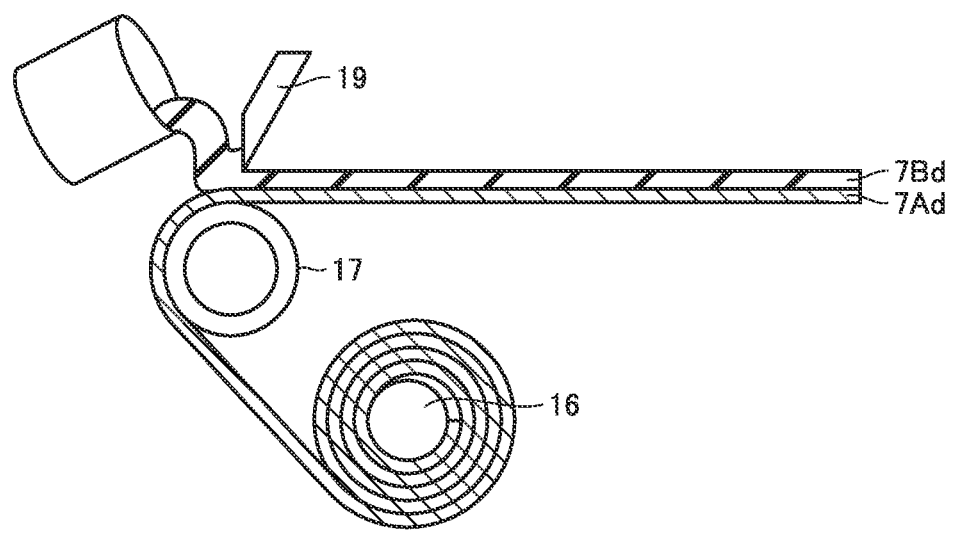
FIG. 6 is a schematic diagram showing the second step of the method of manufacturing the power semiconductor device in the first embodiment.

FIG. 6 is a schematic diagram showing the second step of the method of manufacturing the power semiconductor device in the first embodiment. Referring to FIG. 6, a sheet-shaped metal sheet 7Ad that is to be formed as a metal sheet 7A is wound around a roller 16. Sheet-shaped metal sheet 7Ad is pulled out by a roller 17. Metal sheet 7Ad pulled out in this case has flexibility at a normal temperature. For example, a paste-like resin material that is to be formed as first insulating sheet 7B is applied onto the surface of the pulled-out metal sheet 7Ad. This resin material on metal sheet 7Ad is finished by a squeegee 19 so as to have an intended thickness. Thereby, the resin material is formed as a first insulating sheet 7Bd on metal sheet 7Ad.

Figure 7:
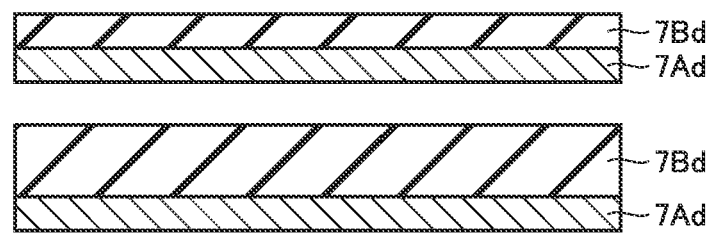
FIG. 7 is a schematic cross-sectional view showing the third step of the method of manufacturing the power semiconductor device in the first embodiment.

FIG. 7 is a schematic cross-sectional view showing the third step of the method of manufacturing the power semiconductor device in the first embodiment. Referring to FIG. 7, two members are prepared, each of which includes first insulating sheet 7Bd formed on metal sheet 7Ad in the step in FIG. 6. In this case, the amount of the resin material to be applied is adjusted. Thereby, two first insulating sheets 7Bd are adjusted in thickness such that one first insulating sheet 7Bd is thicker than the other first insulating sheet 7Bd. The two members each including first insulating sheet 7Bd formed on metal sheet 7Ad each are cut to have a main surface sized equally to the main surface of substrate 7 that is to be finally formed.

Two first insulating sheets 7Bd each are adjusted in thickness based on the difference of the coefficient of linear expansion between metal sheet 7Ad and each of these two first insulating sheets 7Bd such that the surface of frame member 50 prepared in the step in FIG. 6 that comes into contact with the substrate (formed later) has a shape conforming to the shape curved by deformation, as shown in FIGS. 3 and 4. For example, the following is an explanation about the case where the surface of frame member 50 that comes into contact with substrate 7 has a shape curving to protrude upward as shown in FIG. 3, and that coefficient of linear expansion α2 of the insulating sheet is greater than coefficient of linear expansion α1 of the metal sheet. In this case, first insulating sheet 7Bd that is finally formed as first insulating sheet 7B of the substrate is adjusted to be thinner than first insulating sheet 7Bd that is finally formed as second insulating sheet 7C of the substrate. Similarly, for example, in the cases where the surface of frame member 50 that comes into contact with the substrate has a shape curving to protrude downward as shown in FIG. 4 and where α1<α2, first insulating sheet 7Bd that is finally formed as first insulating sheet 7B of the substrate is adjusted to be thicker than first insulating sheet 7Bd that is finally formed as second insulating sheet 7C of the substrate.

Figure 8:
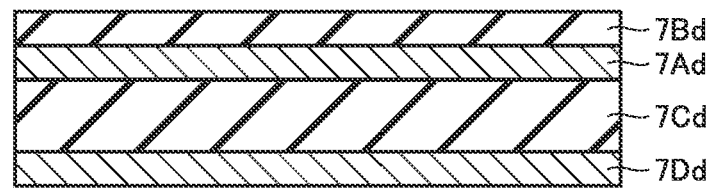
FIG. 8 is a schematic cross-sectional view showing the fourth step of the method of manufacturing the power semiconductor device in the first embodiment.

FIG. 8 is a schematic cross-sectional view showing the fourth step of the method of manufacturing the power semiconductor device in the first embodiment. Referring to FIG. 8, two members each including metal sheet 7Ad and first insulating sheet 7Bd prepared in FIG. 7 are stacked on each other. In this case, these two members are stacked such that first insulating sheet 7Bd of the lower member comes into contact with the lower main surface of metal sheet 7Ad of the upper member. Hereinbelow, first insulating sheet 7Bd of the lower member of the two stacked members will be referred to as a second insulating sheet 7Cd while metal sheet 7Ad below second insulating sheet 7Cd will be referred to as a metal sheet 7Dd, as shown in FIG. 8.

Figure 9:
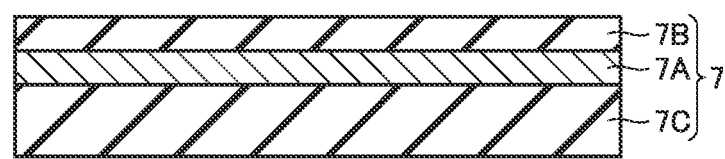
FIG. 9 is a schematic cross-sectional view showing the fifth step of the method of manufacturing the power semiconductor device in the first embodiment.

FIG. 9 is a schematic cross-sectional view showing the fifth step of the method of manufacturing the power semiconductor device in the first embodiment. Referring to FIG. 9, the sheets stacked in the state shown in FIG. 8 are heated, thereby forming a stack of first insulating sheet 7Bd, metal sheet 7Ad, second insulating sheet 7Cd, and metal sheet 7Dd arranged in this order from the top and integrated with one another. Then, lowermost metal sheet 7Dd is peeled off. This leads to substrate 7 formed by stacking first insulating sheet 7B, metal sheet 7A, and second insulating sheet 7C that are arranged in this order from the top and integrated with one another. In this stage, each of members forming substrate 7 does not have to be completely hardened by heating. In addition, substrate 7 formed by heating as described above is curved with respect to the thickness direction due to the difference of the coefficient of linear expansion between metal sheet 7A and each of first insulating sheet 7B and second insulating sheet 7C.

Frame member 50 shown in FIG. 5 and substrate 7 shown in FIGS. 6 to 9 may be formed in any sequential order. In other words, substrate 7 may be formed before frame member 50, or frame member 50 may be formed before substrate 7.

Figure 10:
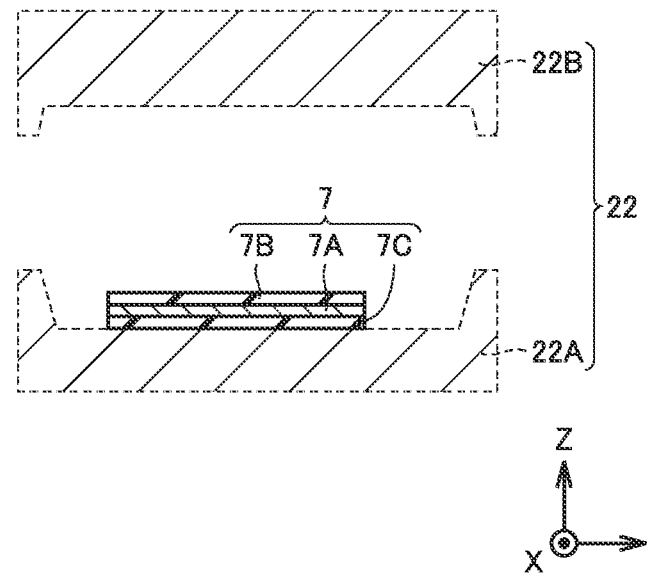
FIG. 10 is a schematic cross-sectional view showing the sixth step of the method of manufacturing the power semiconductor device in the first embodiment.

FIG. 10 is a schematic cross-sectional view showing the sixth step of the method of manufacturing the power semiconductor device in the first embodiment. Referring to FIG. 10, a mold 22 is prepared. Mold 22 has a lower mold 22A and an upper mold 22B. Lower mold 22A is formed in a container shape. Substrate 7 formed in the step in FIG. 9 is placed inside a container-shaped portion of lower mold 22A.

Figure 11:
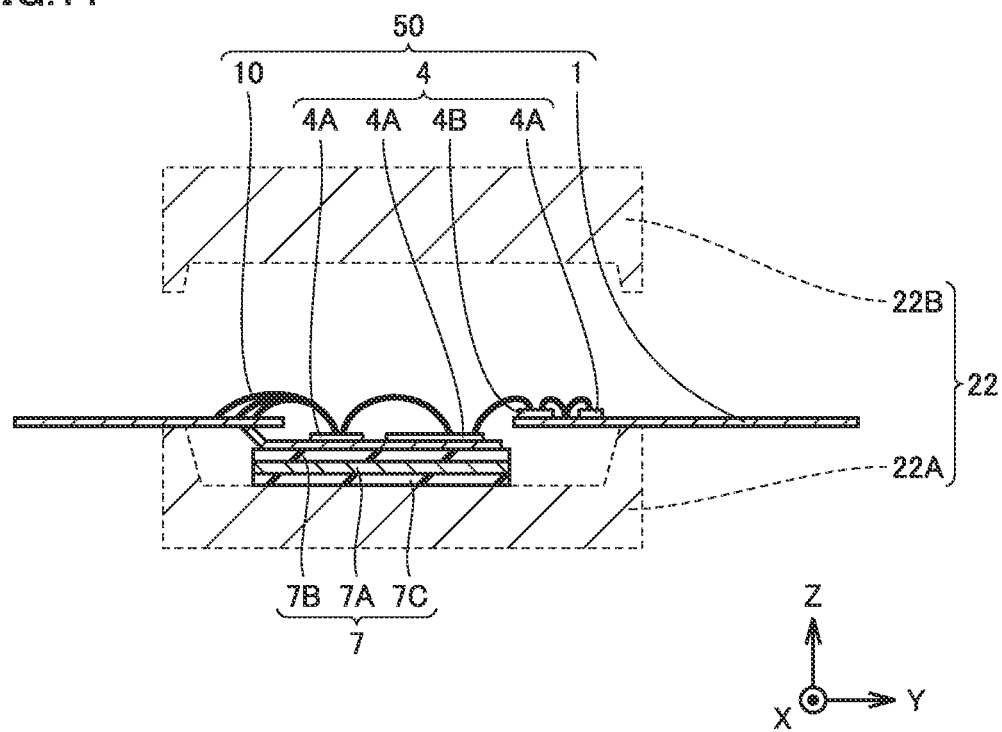
FIG. 11 is a schematic cross-sectional view showing the seventh step of the method of manufacturing the power semiconductor device in the first embodiment.

FIG. 11 is a schematic cross-sectional view showing the seventh step of the method of manufacturing the power semiconductor device in the first embodiment. Referring to FIG. 11, frame member 50 formed in the step in FIG. 5 is placed on substrate 7 placed inside the container-shaped portion of lower mold 22A. As shown in FIG. 11, frame 1d and external terminal 2d may be disposed to partially extend outward beyond the container-shaped portion of lower mold 22A. In this case, it is preferable that mold 22 is heated in advance.

Figure 12:
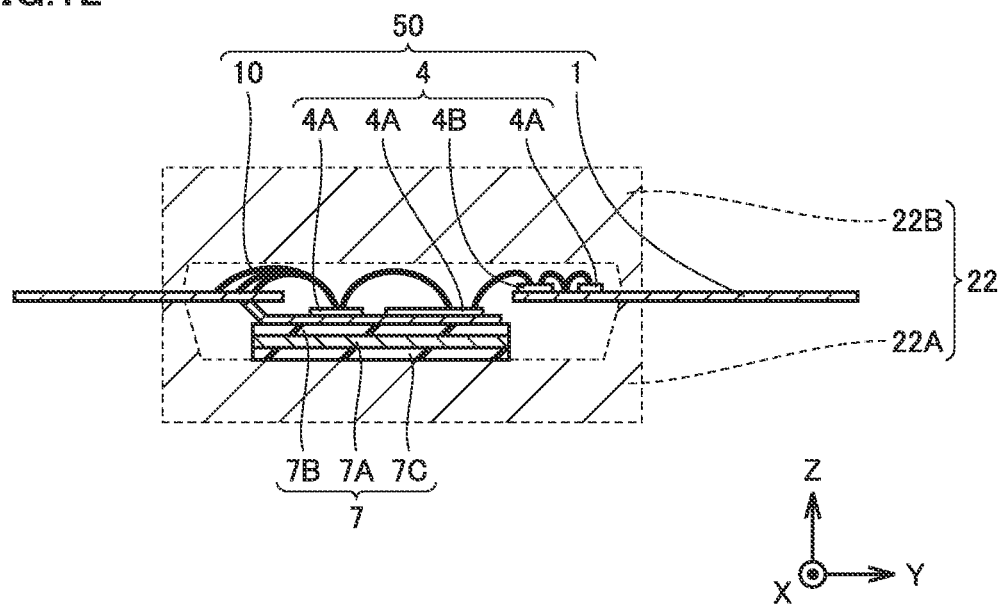
FIG. 12 is a schematic cross-sectional view showing the eighth step of the method of manufacturing the power semiconductor device in the first embodiment.

FIG. 12 is a schematic cross-sectional view showing the eighth step of the method of manufacturing the power semiconductor device in the first embodiment. Referring to FIG. 12, upper mold 22B forming mold 22 is placed on lower mold 22A on which substrate 7 and frame member 50 are disposed as shown in FIG. 11. Upper mold 22B is provided as a cover of lower mold 22A. Thus, upper mold 22B is mounted directly above lower mold 22A so as to engage with lower mold 22A. Thereby, upper mold 22B is positioned as a cover of lower mold 22A so as to close the container-shaped portion of lower mold 22A. As shown in FIG. 12, in the state closed by upper mold 22B as a cover, frame 1d and external terminal 2d may be disposed to partially extend outward beyond the container-shaped portion of lower mold 22A. Through the above-described steps in FIGS. 10 to 12, substrate 7 is combined with frame member 50.

Figure 13:
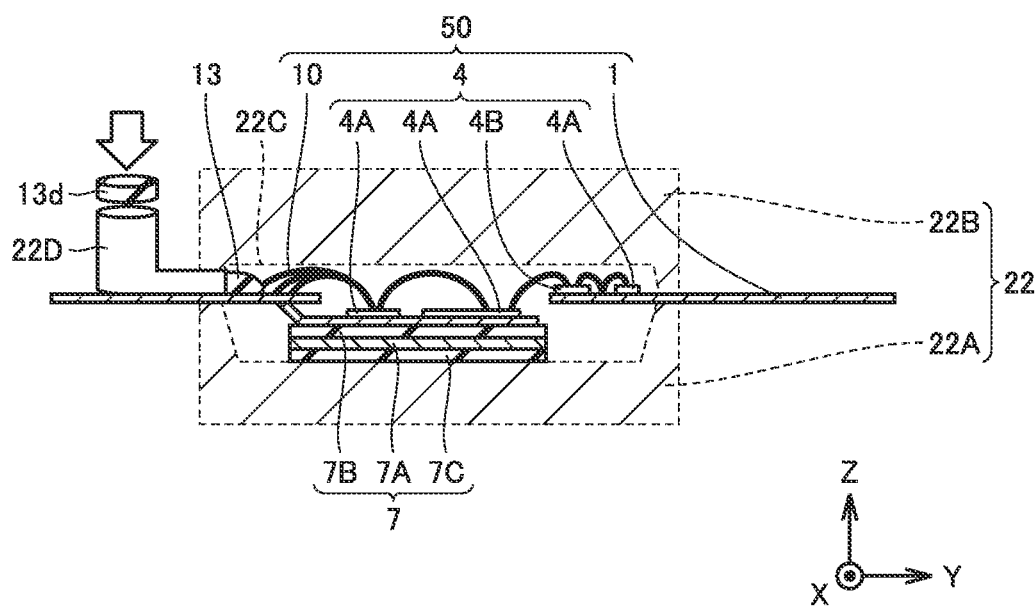
FIG. 13 is a schematic cross-sectional view showing the ninth step of the method of manufacturing the power semiconductor device in the first embodiment.

FIG. 13 is a schematic cross-sectional view showing the ninth step of the method of manufacturing the power semiconductor device in the first embodiment. Referring to FIG. 13, as a result of closure of mold 22 as shown in FIG. 12, lower mold 22A and upper mold 22B form one relatively large space region 22C, in which the arrangement state where substrate 7 and frame member 50 are combined is maintained. Mold 22 is provided with a tablet insertion member 22D, for example, formed in a tubular shape and leading from outside to the inside of space region 22C. A sealing resin tablet 13d to be formed as sealing resin 13 is introduced into this tablet insertion member 22D. Sealing resin tablet 13d is a solid tablet made of an epoxy resin, for example. Tablet insertion member 22D has a portion extending in the Z direction and a portion bent to extend in the Y direction and reach space region 22C, for example, as shown in FIG. 13. The structure of tablet insertion member 22D is not limited to the above-described structure.

Sealing resin tablet 13d introduced into tablet insertion member 22D is gradually pushed as indicated by an arrow in the figure so as to be moved through tablet insertion member 22D into space region 22C. Thereby, sealing resin tablet 13d is pressurized and gradually introduced into space region 22C while being increased in fluidity. In this way, space region 22C is filled with the resin material having fluidity. Since mold 22 is heated, the resin material inside the above-mentioned space region 22C is hardened with this heat so as to become sealing resin 13. With this sealing resin 13, substrate 7 and frame member 50 are hardened and bonded so as to come into contact with each other. Thus, substrate 7 and frame member 50 integrally kept in contact with each other are hardened. More specifically, power semiconductor device 100 is formed in such a manner that first insulating sheet 7B forming substrate 7 and the lower surface of frame 1C are in contact with each other in an integrated manner.

<Functions and Effects>

The following is an explanation about an object of a comparative example of the present embodiment, and also an explanation about the configuration of the present embodiment and the functions and effects obtained therefrom.

As a comparative example, for example, it is assumed that the surface of frame 1C (in the pre-assembly state in FIG. 3) coming into contact with substrate 7 curves to protrude upward, whereas the main surface of substrate 7 curves to protrude downward, with the result that the curving directions of both surfaces do not coincide with each other. In the comparative example, for example, in the steps in FIGS. 11 to 13, the lower surface of frame 1C does not come into contact with the surface of first insulating sheet 7B of substrate 7, thereby deteriorating the adhesiveness therebetween. As a result, the heat dissipation performance and the insulation performance between semiconductor element 4 and substrate 7 may deteriorate. If substrate 7 and the like are relatively thick, their surface flatness is improved to thereby allow improvement in adhesiveness. This however increases the material cost. For this reason, it is desirable to ensure high adhesiveness between frame 1C and each of substrate 7 and the like even though substrate 7 and the like are relatively thin.

Thus, power semiconductor device 100 according to the present disclosure includes frame 1, semiconductor element 4, substrate 7, and sealing resin 13. Semiconductor element 4 is disposed on frame 1. Substrate 7 is disposed on the side of frame 1 opposite to the side on which semiconductor element 4 is disposed. Sealing resin 13 seals semiconductor element 4 and substrate 7. Substrate 7 includes: metal sheet 7A; first insulating sheet 7B on one main surface side of metal sheet 7A; and second insulating sheet 7C on the other main surface side of metal sheet 7A opposite to the one main surface side. Metal sheet 7A has flexibility at a normal temperature.

For example, if first insulating sheet 7B and second insulating sheet 7C each are formed of a thermosetting resin that is hardened and shrunk by heating, first insulating sheet 7B and second insulating sheet 7C are hardened and shrunk by heating during the process. Also, in substrate 7, metal sheet 7A is different in material properties and in coefficient of linear expansion from each of first insulating sheet 7B and second insulating sheet 7C. This causes curving that results from the dimensional change in the members (forming substrate 7) that is caused in accordance with the difference of the coefficient of linear expansion between these members. Accordingly, by controlling the difference of the coefficient of linear expansion between the members forming substrate 7, the curving direction of substrate 7 can be directed to coincide with the curving direction of frame 1C that should be brought into close contact with substrate 7. Furthermore, metal sheet 7A has flexibility. Thus, when first insulating sheet 7B and second insulating sheet 7C shrink and curve, metal sheet 7A sandwiched between these sheets can be readily similarly curved. Due to the above circumstances, for example, in the steps in FIGS. 11 to 13, the lower surface of frame 1C readily comes into contact with the surface of first insulating sheet 7B of substrate 7, thereby improving the adhesiveness therebetween. Thus, even if frame 1C and substrate 7 are relatively thin, substrate 7 excellently comes into close contact with the lower surface of frame 1C, thereby achieving power semiconductor device 100 having excellent heat dissipation performance and insulation performance.

In power semiconductor device 100 as described above, frame 1C as at least a part of frame 1 is disposed such that the lower side of frame 1C opposite to its upper side having semiconductor element 4 disposed thereon comes into contact with substrate 7. The thicknesses of first insulating sheet 7B and second insulating sheet 7C are set such that the first direction in which frame 1C curves with respect to the thickness direction coincides with the second direction in which substrate 7 curves with respect to the thickness direction due to the difference of the coefficient of linear expansion between metal sheet 7A and each of first insulating sheet 7B and second insulating sheet 7C.

The thicknesses of first insulating sheet 7B and second insulating sheet 7C are controlled, that is, changed as appropriate, thereby controlling their volumes. Even if first insulating sheet 7B and second insulating sheet 7C are made of the material having the same properties, their volumes are controlled to thereby capable of providing a difference, for example, in amount of shrinkage caused by heating of the resin materials of these insulating sheets. By using the above-mentioned control and, for example, the difference in shrinkage amount between the metal sheet and the insulating sheet caused by the difference in coefficient of linear expansion based on the difference of the material properties between the metal sheet and the insulating sheet, the second direction corresponding to the curving direction of the entire substrate 7 can coincide with the first direction, for example, corresponding to the original curving direction of frame 1C that is to be brought into close contact with substrate 7. In other words, the balance of force applied by each of first insulating sheet 7B and second insulating sheet 7C to metal sheet 7A in the entire metal sheet 7A is adjusted. Thereby, the direction in which the entire substrate 7 curves can be arbitrarily adjusted such that substrate 7 protrudes upward or protrudes downward. Furthermore, the curvature of the curve of substrate 7 can also be controlled to be an arbitrary curvature by controlling the thickness (that is, the volume) of each of first insulating sheet 7B and second insulating sheet 7C. This consequently allows improvement in adhesiveness between substrate 7 and frame 1C, and accordingly, allows improvement in heat dissipation performance and insulation performance as described above.

In the above-mentioned power semiconductor device 100, the thickness of metal sheet 7A is equal to or greater than 0.01 mm and equal to or less than 0.2 mm. Metal sheet 7A is formed of the material selected from the group consisting of copper, iron, aluminum, and stainless steel. This can provide substrate 7 including metal sheet 7A that has excellent flexibility and that readily follows deformation and curving of each insulating sheet.

According to the method of manufacturing power semiconductor device 100 in the present disclosure, semiconductor element 4 is mounted on frame 1C to thereby obtain frame member 50. Then, substrate 7 is prepared that includes: metal sheet 7A having flexibility at a normal temperature; first insulating sheet 7B on the upper side corresponding to one main surface side of metal sheet 7A; and second insulating sheet 7C on the lower side corresponding to the other main surface side of metal sheet 7A that is opposite to the one main surface side. Substrate 7 is combined with frame member 50. Substrate 7 and frame member 50 are hardened and bonded to each other with sealing resin 13 in the state where substrate 7 is combined with frame member 50. In the step of preparing substrate 7, the thicknesses of first insulating sheet 7B and second insulating sheet 7C are adjusted based on the difference of the coefficient of linear expansion between metal sheet 7A and each of first insulating sheet 7B and second insulating sheet 7C such that substrate 7 has a shape conforming to deformation of frame member 50.

According to the method of manufacturing power semiconductor device 100, the similar function and effect are achieved basically based on the same theory as that for the function and effect achieved by power semiconductor device 100 according to the above-described present disclosure. Specifically, by controlling the thickness of each insulating sheet and utilizing the difference of the coefficient of linear expansion between each insulating sheet and the metal sheet, frame 1C and substrate 7 can be adjusted to be curved in the same direction in the step of hardening and bonding substrate 7 and frame member 50 to each other. Thereby, the area in which frame 1C and substrate 7 come into close contact with each other can be sufficiently increased, so that the adhesiveness therebetween can be improved. As a result, the heat dissipation performance and the insulation performance between frame 1C and substrate 7 can be improved.

<Modification>

In the above description, first insulating sheet 7B and second insulating sheet 7C are made of the material having the same properties and adjusted to have thicknesses of different values. Thereby, in consideration of the difference of the coefficient of linear expansion between metal sheet 7A and each of these insulating sheets, the first direction in which frame 1C curves and the second direction in which substrate 7 curves are adjusted to coincide with each other. In the power semiconductor device according to the present embodiment, however, on the condition that first insulating sheet 7B and second insulating sheet 7C are adjusted to have thicknesses having an approximately same value, first insulating sheet 7B and second insulating sheet 7C may be formed of materials having different properties.

Furthermore, according to the method of manufacturing the power semiconductor device in the present embodiment, in the step of preparing substrate 7, first insulating sheet 7B and second insulating sheet 7C may be formed of the materials having different properties in the state where first insulating sheet 7B and second insulating sheet 7C are formed to have thicknesses having an approximately same value. Also in these cases, similarly to the above, the curving direction of frame 1C can be controlled to coincide with the curving direction of substrate 7 in consideration of the difference of the coefficient of linear expansion between first insulating sheet 7B and metal sheet 7A, and between second insulating sheet 7C and metal sheet 7A. In other words, substrate 7 can be adjusted to have a shape conforming to the deformation of frame member 50 based on the difference of the coefficient of linear expansion between first insulating sheet 7B and metal sheet 7A, and between second insulating sheet 7C and metal sheet 7A.

Second Embodiment

Figure 14:
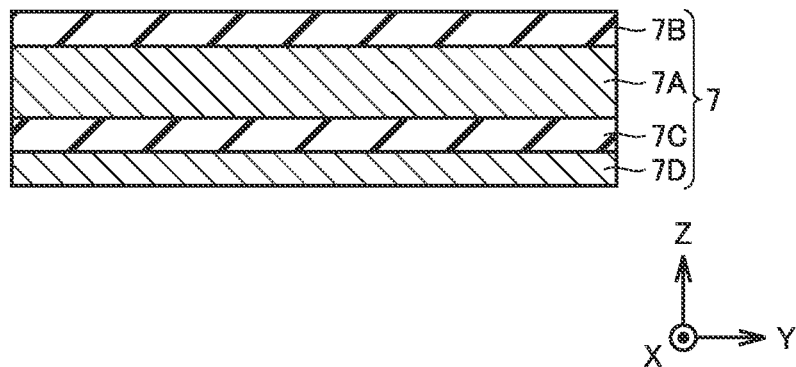
FIG. 14 is a schematic cross-sectional view showing the configuration of a substrate included in a power semiconductor device in the second embodiment.
Figure 15:
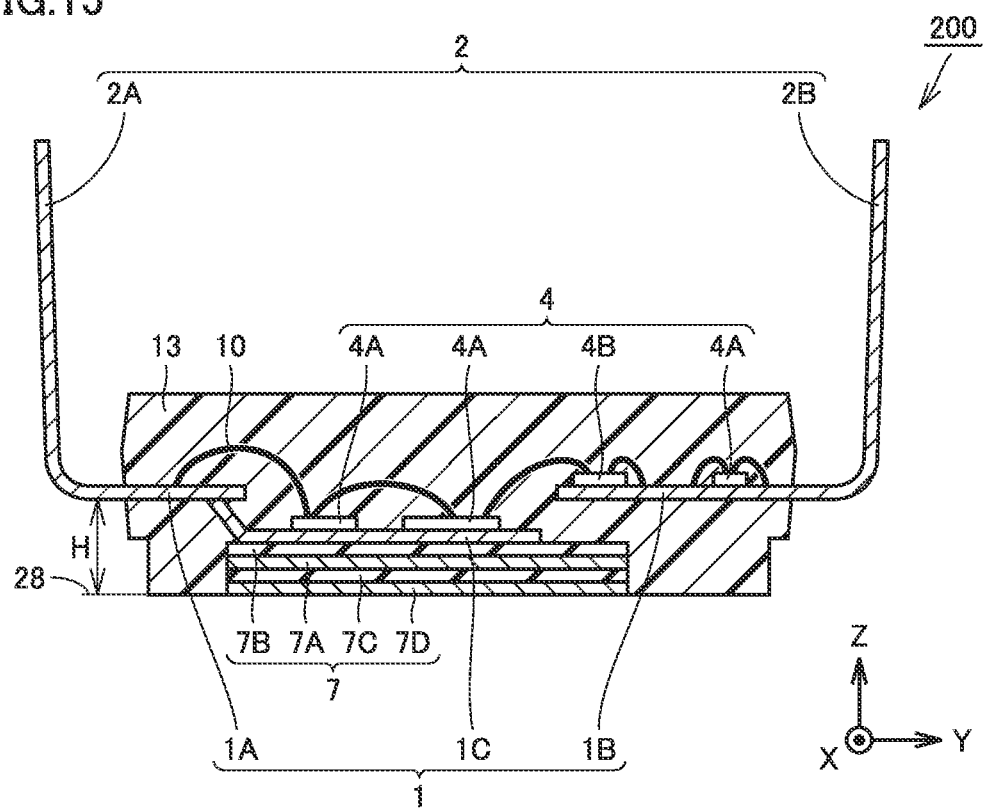
FIG. 15 is a schematic cross-sectional view showing the configuration of the power semiconductor device in the second embodiment.

FIG. 14 is a schematic cross-sectional view showing the configuration of a substrate included in a power semiconductor device in the second embodiment. FIG. 15 is a schematic cross-sectional view showing the configuration of the power semiconductor device in the second embodiment. Referring to FIGS. 14 and 15, a power semiconductor device 200 in the present embodiment has a configuration approximately similar to that of power semiconductor device 100 in the first embodiment. Thus, in FIGS. 14 and 15, the same components as those in power semiconductor device 100 will be designated by the same reference characters, and the description of the same features will not be repeated. In the present embodiment, substrate 7 further includes a metal sheet 7D as another metal sheet on the side of second insulating sheet 7C opposite to the side facing metal sheet 7A (that is, on the lower side of second insulating sheet 7C in the Z direction). In other words, substrate 7 in the present embodiment has a four-layer structure. In this point, the present embodiment is structurally different from the first embodiment having a three-layer structure in which substrate 7 does not include metal sheet 7D.

According to the method of manufacturing power semiconductor device 200 in the present embodiment, metal sheet 7Dd in FIG. 8 is not removed. Thus, in the present embodiment, metal sheet 7Ad, first insulating sheet 7Bd, second insulating sheet 7Cd, and metal sheet 7Dd in FIG. 8 are used as they are as substrate 7 in FIG. 14.

It should be noted that metal sheet 7D is preferably identical in material properties and thickness to metal sheet 7A in the first embodiment.

In addition to the function and effect similar to those in the first embodiment, the following function and effect are achieved in the present embodiment. Due to addition of metal sheet 7D to substrate 7, the curving direction of substrate 7 can be controlled by controlling the thicknesses of not only the insulating sheets but also two metal sheets 7A and 7D in substrate 7, and also by utilizing the difference of the coefficient of linear expansion between the metal sheet and the insulating sheet. Furthermore, not only first insulating sheet 7B and second insulating sheet 7C but also two metal sheets 7A and 7D can be controlled in thickness. Accordingly, the curvature of the curve of substrate 7 can be controlled more accurately as compared with the first embodiment.

In the present embodiment, two metal sheets 7A and 7D are made of materials having different properties and formed to have the same thickness, so that the curving direction of substrate 7 can also be controlled. This is based on the feature similar to that in the first embodiment that the curving direction of substrate 7 may be controlled by forming two insulating sheets using materials having different properties so as to have the same thickness.

Furthermore, since the number of metal sheets in the present embodiment is greater than that in the first embodiment, the heat generated from switching element 4A can be more efficiently dissipated by utilizing the heat dissipation performance of the metal sheets.

Furthermore, in the present embodiment, as the number of metal sheets is increased as compared with that in the first embodiment, a distance H between the horizontally extending portion of frame 1A or external terminal 2A shown in FIG. 15 and a heat dissipation surface 28 having power semiconductor device 100 mounted thereon is increased as compared with that in the first embodiment. This consequently can improve the performance of insulation by first insulating sheet 7B and second insulating sheet 7C from the conductive member and the like existing below heat dissipation surface 28.

Third Embodiment

Figure 16:
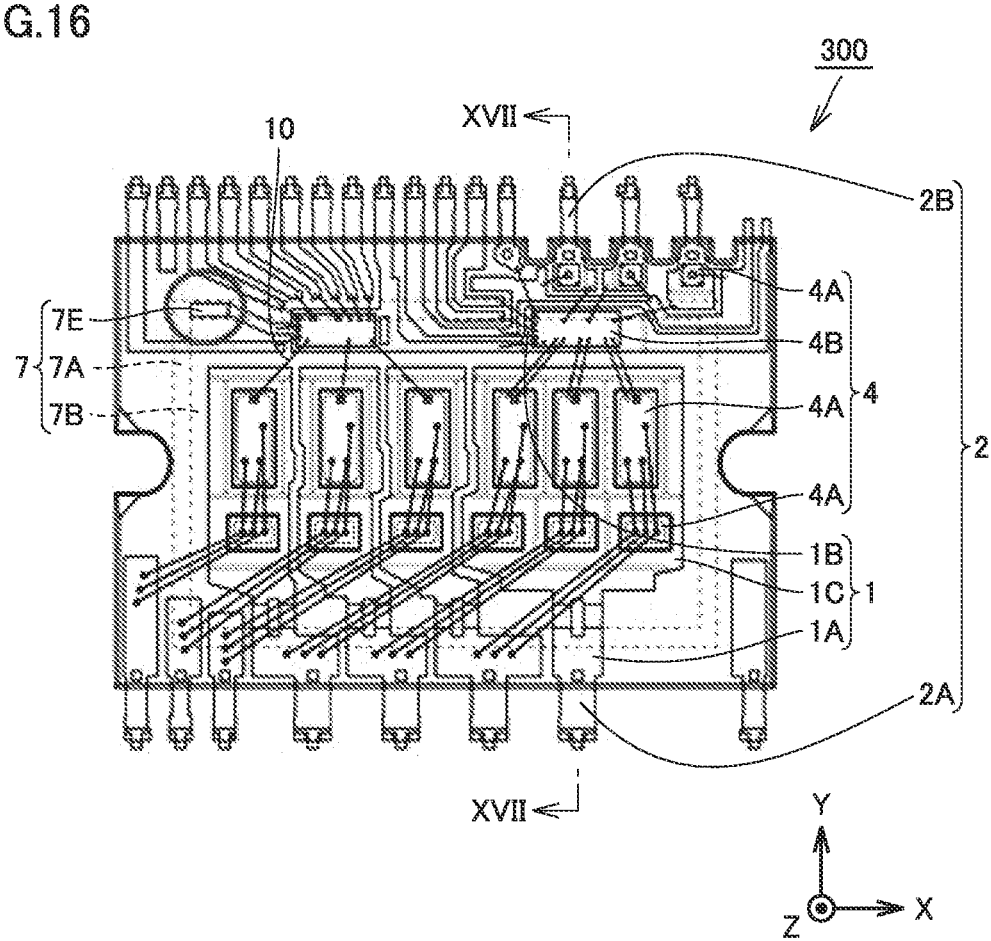
FIG. 16 is a schematic plan view showing the configuration of a power semiconductor device in the third embodiment.
Figure 17:
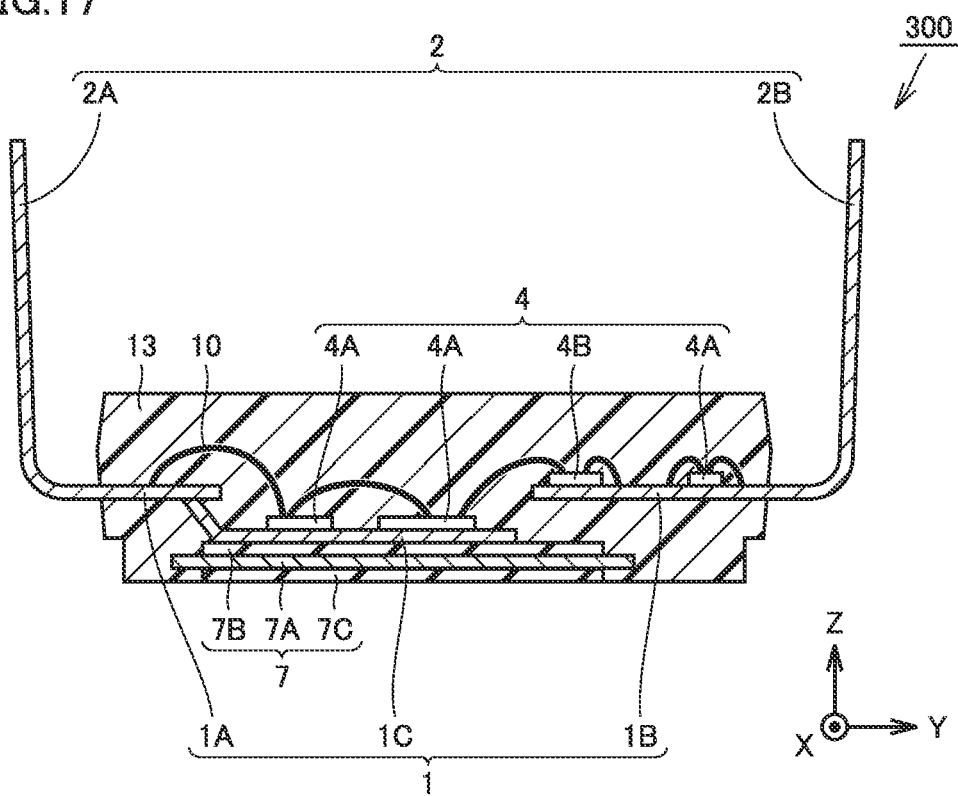
FIG. 17 is a schematic cross-sectional view showing the configuration of the power semiconductor device in the third embodiment.

FIG. 16 is a schematic plan view showing the configuration of a power semiconductor device in the third embodiment. FIG. 17 is a schematic cross-sectional view showing the configuration of the power semiconductor device in the third embodiment. Referring to FIGS. 16 and 17, a power semiconductor device 300 in the present embodiment has approximately the same configuration as that of power semiconductor device 100 in the first embodiment. Thus, in FIGS. 16 and 17, the same components as those in power semiconductor device 100 will be designated by the same reference characters, and the description of the same features will not be repeated. In the present embodiment, an electrode 7E (that is, a terminal) is provided that can apply an electric potential at a constant value to the entire metal sheet 7A of substrate 7. In this case, the term "an electric potential at a constant value" is not limited to the electric potential having completely the same value, but means the electric potential having a value including a certain error with respect to a median value of the electric potentials among the regions of metal sheet 7A. For achieving such a configuration, metal sheet 7A may be configured to have an outer edge portion extending slightly outward beyond the outer edge portion of the insulating sheet, as shown in FIG. 17. Electrode 7E is pulled out, for example, from the upper left region in FIG. 16 that is a part of metal sheet 7A so as to be electrically connected to metal sheet 7A.

In addition to the function and effect similar to those in the first embodiment, the following function and effect are achieved in the present embodiment. The electric potential having the same value is applied to the entire metal sheet 7A, so that the effect of providing a shield against the noise generated from switching element 4A can be achieved. Therefore, leakage of the noise inside power semiconductor device 300 to the outside thereof can be suppressed while incoming of the noise from the outside of power semiconductor device 300 to the inside thereof can also be suppressed.

Fourth Embodiment

Figure 18:
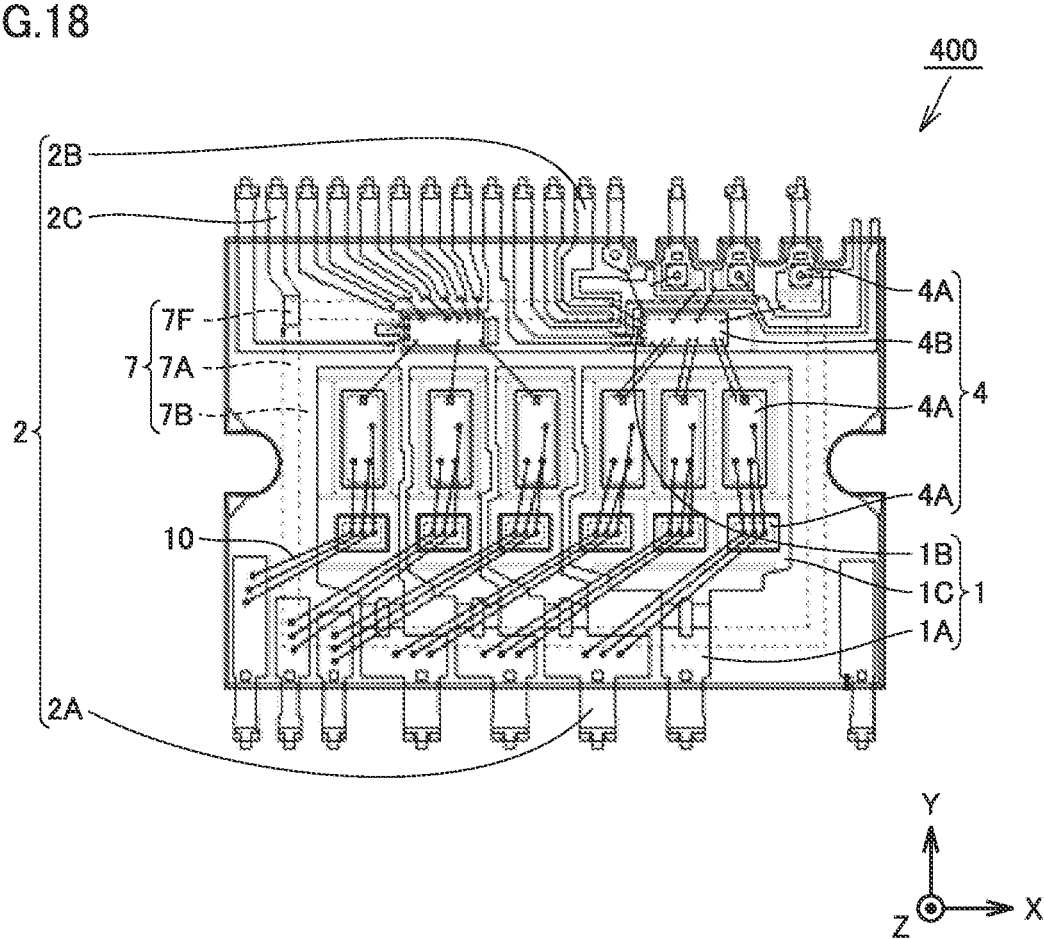
FIG. 18 is a schematic plan view showing the configuration of a power semiconductor device in the fourth embodiment.

FIG. 18 is a schematic plan view showing the configuration of a power semiconductor device in the fourth embodiment. Referring to FIG. 18, a power semiconductor device 400 in the present embodiment has approximately the same configuration as that of power semiconductor device 100 in the first embodiment. Thus, in FIG. 18, the same components as those in power semiconductor device 100 will be designated by the same reference characters, and the description of the same features will not be repeated. In the present embodiment, external terminal 2 includes an external terminal 2C disposed independently and separately from frame 1, in addition to external terminals 2A and 2B integrated with frames 1A and 1B, respectively. Like external terminals 2A and 2B, external terminal 2C is connectable to the outside of power semiconductor device 400. Metal sheet 7A has a terminal joining portion 7F, for example, in the upper left region in FIG. 18. Metal sheet 7A is electrically connected to external terminal 2C through terminal joining portion 7F.

In addition to the function and effect similar to those in the first embodiment, the following function and effect are achieved in the present embodiment. In the configuration as described above, after external terminal 2C and terminal joining portion 7F (that is, metal sheet 7A) are mounted so as to be electrically connected to each other, a user can freely change the voltage applied from external terminal 2C of power semiconductor device 400.

Fifth Embodiment

Figure 19:
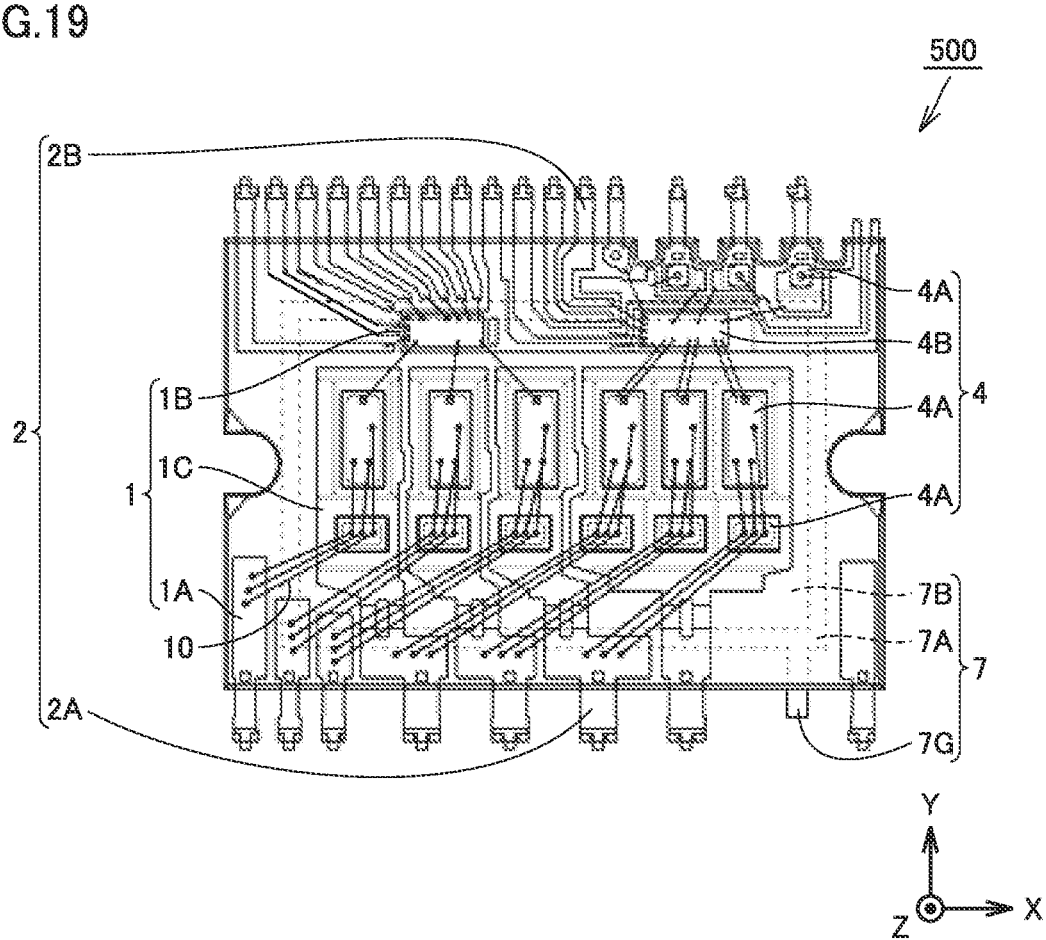
FIG. 19 is a schematic plan view showing the configuration of a power semiconductor device in the fifth embodiment.

FIG. 19 is a schematic plan view showing the configuration of a power semiconductor device in the fifth embodiment. Referring to FIG. 19, a power semiconductor device 500 in the present embodiment has approximately the same configuration as that of power semiconductor device 100 in the first embodiment. Thus, in FIG. 19, the same components as those in power semiconductor device 100 will be designated by the same reference characters, and the description of the same features will not be repeated. In the present embodiment, a part of metal sheet 7A extends to the outside of power semiconductor device 400 in plan view. In other words, metal sheet 7A has a metal sheet pull-out region 7G that is pulled out, for example, from the lower right region in FIG. 19 such that a part of metal sheet 7A extends to the negative side in the Y direction. Metal sheet pull-out region 7G is pulled out in an arbitrary direction, and may be pulled out to extend in the X direction, for example. Alternatively, metal sheet pull-out region 7G may have a region extending in the X direction and a region extending in the Y direction, for example. Also, a boundary portion between these regions may have a bent shape.

In addition to the functions and effects similar to those in the first and fourth embodiments, the following function and effect are achieved in the present embodiment. According to the configuration as described above, metal sheet 7A is not connected to external terminal 2C through terminal joining portion 7F as in the fourth embodiment, but metal sheet 7A is directly connected to the outside of power semiconductor device 500. Thus, the number of connecting portions between the members from metal sheet 7A to the outside of power semiconductor device 500 can be significantly reduced, thereby allowing improvement in its mountability.

Sixth Embodiment

Figure 20:
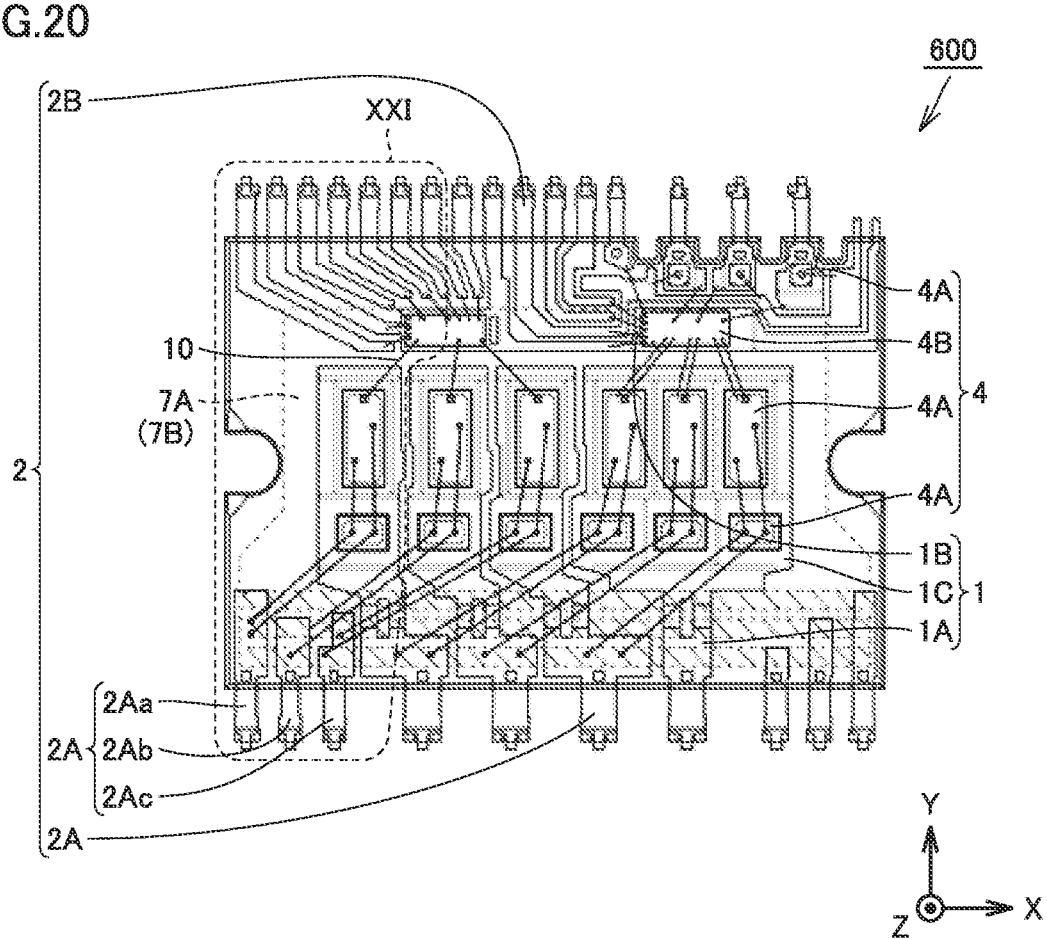
FIG. 20 is a schematic plan view showing the configuration of a power semiconductor device in the sixth embodiment.
Figure 21:
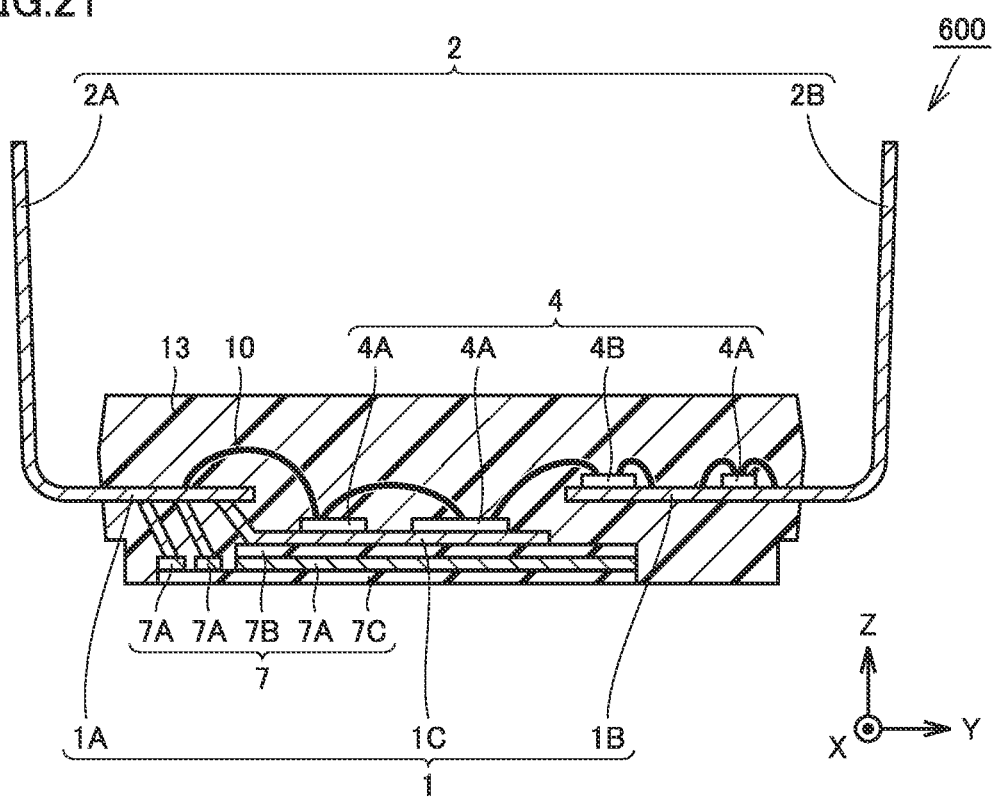
FIG. 21 is a schematic side view of a region XXI surrounded by a dotted line in FIG. 20 as seen from the positive side in the Y direction.

FIG. 20 is a schematic plan view showing the configuration of a power semiconductor device in the sixth embodiment. FIG. 21 is a schematic side view of a region XXI surrounded by a dotted line in FIG. 20 as seen from the positive side in the Y direction. Referring to FIGS. 20 and 21, a power semiconductor device 600 in the present embodiment has approximately the same configuration as that of power semiconductor device 100 in the first embodiment. Thus, in FIGS. 20 and 21, the same components as those in power semiconductor device 100 will be designated by the same reference characters, and the description of the same features will not be repeated. In the present embodiment, for example, frame 1A as at least a part of frame 1 is divided into three portions while metal sheet 7A is also divided into three portions. Specifically, each of frame 1A and metal sheet 7A is divided into three portions in a region on the relatively negative side in the Y direction inside sealing resin 13. At least one of three divided metal sheets 7A is connected to at least one of three divided frames 1A.

In FIG. 21, a right-side portion of three divided frames 1A is connected to a right-side portion of three divided metal sheets 7A and leads to an external terminal 2Aa. A central portion of three divided frames 1A is connected to a central portion of three divided metal sheets 7A and leads to an external terminal 2Ab. A left-side portion of three divided frames 1A is connected to a left-side portion of three divided metal sheets 7A and leads to an external terminal 2Ac.

In the present embodiment, frame 1A as at least a part of frame 1 is divided into a plurality of regions while metal sheet 7A is divided into a plurality of regions, as described above. At least one of the plurality of divided metal sheets 7A is connected to at least one of the plurality of divided frames 1A. Thereby, the following function and effect are achieved in addition to the function and effect in the first embodiment. Specifically, according to the present embodiment, for example, external terminal 2Aa in FIG. 20 can be connected to a p terminal of a pn terminal included in a power supply used on the user side, and external terminal 2Ab adjacent to this external terminal 2Aa can be connected to an n terminal of the pn terminal. In other words, by using the plurality of divided metal sheet 7A and the plurality of divided frames 1A, each of the plurality of terminals having different properties can be connected to a corresponding one of the divided metal sheets 7A and a corresponding one of the divided frames 1A. Thereby, the flexibility of the circuit configuration connectable to the frame of power semiconductor device 400 can be enhanced.

The characteristics described in (the respective examples included in) the respective embodiments set forth above may be applied to be combined as appropriate within the range where technical inconsistency does not occur.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:
1. A power semiconductor device comprising:
a frame;
a semiconductor element disposed on the frame;
a substrate disposed on a side of the frame opposite to a side on which the semiconductor element is disposed; and
a sealing resin that seals the semiconductor element and the substrate, wherein
the substrate includes a metal sheet, a first insulating sheet on one main surface side of the metal sheet, and a second insulating sheet on the other main surface side of the metal sheet opposite to the one main surface side,
the first insulating sheet faces the frame,
at least a part of the frame is disposed to come into contact with the substrate on a side of at least the part of the frame opposite to a side on which the semiconductor element is disposed,
a first thickness of the first insulating sheet is different from a second thickness of the second insulating sheet, in a first direction, at least the part of the frame curves with respect to a thickness direction, in a second direction, the substrate curves with respect to the thickness direction, and the first direction and the second direction coincide with each other.

2. The power semiconductor device according to claim 1, wherein the metal sheet has a thickness equal to or greater than 0.01 mm and equal to or less than 0.2 mm, and the metal sheet is made of a material selected from the group consisting of copper, iron, aluminum, and stainless steel.

3. The power semiconductor device according to claim 1, wherein the substrate further includes another metal sheet on a side of the second insulating sheet opposite to a side facing the metal sheet.

4. The power semiconductor device according to claim 1, comprising an electrode capable of applying an electric potential at a constant value to entirety of the metal sheet.

5. The power semiconductor device according to claim 1, wherein an external terminal connectable to an outside of the power semiconductor device is connected to the frame, and the metal sheet is electrically connected to the external terminal through a terminal joining portion.

6. The power semiconductor device according to claim 1, wherein the metal sheet partially extends to an outside of the power semiconductor device.

7. The power semiconductor device according to claim 1, wherein at least a part of the frame is divided into a plurality of regions, the metal sheet is divided into a plurality of regions, and at least one of the plurality of regions obtained by dividing the metal sheet is connected to at least one of the plurality of regions obtained by dividing at least the part of the frame.

8. The power semiconductor device according to claim 1, wherein when the substrate is convex with respect to a direction in which the frame is arranged, the second thickness of the second insulating sheet is thicker than the first thickness of the first insulating sheet, and when the frame is convex with respect to a direction in which the substrate is arranged, the first thickness of the first insulating sheet is thicker than the second thickness of the second insulating sheet.

9. The power semiconductor device according to claim 1, wherein a first coefficient of linear expansion of the first insulating sheet and the second insulating sheet is greater than a second coefficient of linear expansion of the metal sheet.

* * * * *